United States Patent
Kim et al.

(10) Patent No.: US 6,734,458 B2
(45) Date of Patent: May 11, 2004

(54) TEST PATTERN FOR MEASURING CONTACT RESISTANCE AND METHOD OF MANUFACTURING THE SAME

(75) Inventors: Ki Seog Kim, Kyungki-Do (KR); Young Seon You, Kyungki-Do (KR); Keun Woo Lee, Kyungki-Do (KR); Sung Kee Park, Kyungki-Do (KR)

(73) Assignee: Hynix Semiconductor Inc., Kyungki-do (KR)

( * ) Notice: Subject to any disclaimer, the term of this patent is extended or adjusted under 35 U.S.C. 154(b) by 71 days.

(21) Appl. No.: 10/029,390

(22) Filed: Dec. 28, 2001

(65) Prior Publication Data

US 2003/0100134 A1 May 29, 2003

(30) Foreign Application Priority Data

Nov. 23, 2001 (KR) .................................... 2001-0073419

(51) Int. Cl.[7] .......................... H01L 23/58; H01L 21/66
(52) U.S. Cl. .......................................... 257/48; 438/18
(58) Field of Search ............................ 438/17, 18; 257/48

(56) References Cited

U.S. PATENT DOCUMENTS

| 4,896,108 A | | 1/1990 | Lynch et al. ................. 324/158 |
| 5,450,016 A | | 9/1995 | Masumori .................... 324/713 |
| 5,851,869 A | * | 12/1998 | Urayama ...................... 438/238 |
| 5,872,018 A | | 2/1999 | Lee .............................. 438/18 |
| 6,208,572 B1 | | 3/2001 | Adams et al. ............... 365/201 |

FOREIGN PATENT DOCUMENTS

KR     2001065696 A   *  7/2001   .......... H01L/27/10

* cited by examiner

Primary Examiner—Evan Pert
(74) Attorney, Agent, or Firm—Morgan, Lewis & Bockius LLP

(57) ABSTRACT

The present invention relates to a test pattern for measuring a contact resistance and method of manufacturing the same. In order to confirm that a contact resistance suitable for a semiconductor device before an actual process for manufacturing the device is performed, the present invention designs a test pattern for measuring the contact resistance depending on a design rule of a line contact actually applied to an actual device. At this time, a first line contact region and a second line contact region are formed between a word line so that a line contact region can form a pair; a plurality of sources are formed in the first line contact region and a plurality of sources are formed in the second line contact region wherein neighboring sources are connected by diffusion layers so that the first line contact region and the second line contact region can be electrically connected; and a plurality of line contact patterns are formed so that the plurality of the sources can be electrically connected by every two in each of the first and second line contact regions wherein the line contact pattern formed in the first line contact region and the line contact pattern formed in the second line contact region are alternately positioned. Therefore, the present invention can allow current for measuring the resistance sequentially along the first line contact region and the second line contact region to measure the line contact resistance in which the contact resistance in every source portion is considered.

17 Claims, 13 Drawing Sheets

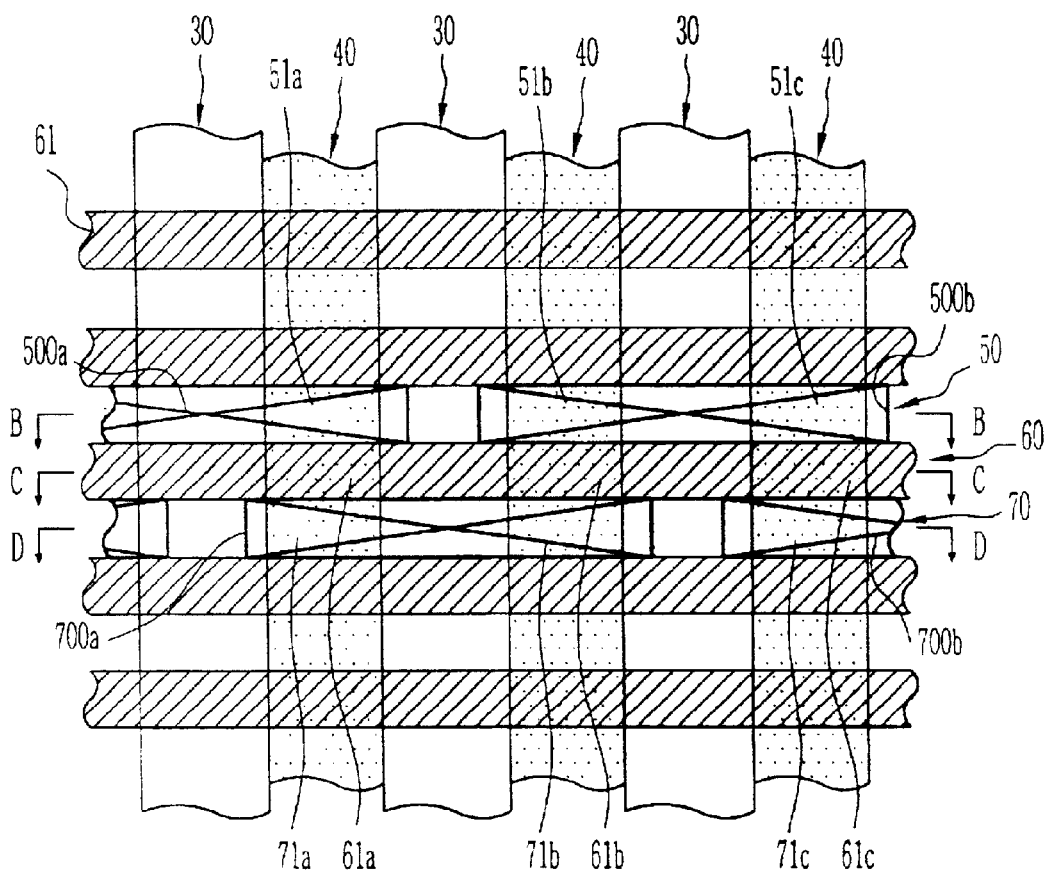

TEST PATTERN FOR MEASURING CONTACT RESISTANCE AND METHOD OF MANUFACTURING THE SAME

BACKGROUND OF THE INVENTION

1. Field of the Invention

The invention relates generally to a test pattern for measuring a contact resistance and method of manufacturing the same, and more particularly to, a test pattern for measuring a contact resistance and method of manufacturing the same, capable of easily measuring a contact resistance in a semiconductor device using a self-aligned line contact.

2. Description of the Prior Art

In general, as the integration level of semiconductor devices, the contact area becomes narrow. As the contact area is narrowed, there is a problem that the contact resistance is increased due to defective contact. Therefore, in order to confirm that the contact resistance suitable for the semiconductor device before an actual process for manufacturing the device is performed, a test pattern for measuring a contact resistance is manufactured depending on a design rule of a contact actually applied to a device and the contact resistance is measured using the manufactured test pattern for measuring a contact resistance.

FIG. 1 is a structure of a test pattern for measuring a conventional contact resistance.

Referring now to FIG. 1, a plurality of device isolation structures 12 are formed in a test wafer 11 to define a plurality of active regions. After word lines (not shown) are formed, a plurality of source/drain diffusion layers 13 are formed by source/drain ion implantation process. An interlayer insulating film (not shown) and a contact hole (not shown) are formed on the entire structure in which the plurality of the source/drain diffusion layers 13 are formed. A contact pattern 14 is formed within the contact hole. Two contact patterns 14 are formed in every source/drain diffusion layer 13. Then, an interconnection pattern 15 for electrically connecting the plurality of the source/drain diffusion layers 13 is formed.

A series of a process of manufacturing a test pattern for measuring a contact resistance is performed based on a design rule of a process of manufacturing an actual device.

As shown in FIG. 1, in the conventional test pattern for measuring a contact resistance, two isolated contact patterns 14 are formed in a single isolated source/drain diffusion layer 13 and the interconnection pattern 15 is formed in the two contact patterns 14, respectively, so that it can be connected to neighboring another contact pattern 14. A flow of current necessary to measure the contact resistance has a two-dimensional current flow in order of the interconnection pattern 15, the contact pattern 14 and the source/drain diffusion layer 13, as a current path 16 shown in FIG. 1.

An ideal total resistance, when the contact pattern 14 preferably contacts the source/drain diffusion layer 13, can be easily found by a general mathematic equation. If the total resistance obtained by the test pattern for measuring a contact resistance is similar to the ideal total resistance, a design rule for manufacturing an actual device is applied. If the total resistance obtained by the test pattern for measuring a contact resistance is higher than the ideal total resistance, it is assumed that a defective contact is generated. Thus, a new design rule is applied or another solution is considered. As such, defective devices can be prevented in advance and unnecessary time and cost could be reduced, by allowing the test pattern for measuring a contact resistance to in advance diagnose a possible problem that can be generated in an actual device.

Recently, a semiconductor device using a self-aligned line contact is formed. However, the contact resistance of the semiconductor device could not be measured using the conventional test pattern for measuring a contact resistance. In other words, the conventional test pattern for measuring a contact resistance is suitable to measure the contact resistance of the device having an isolated source/drain diffusion layer and an isolated contact pattern but is not suitable to measure the contact resistance of a device having a self-aligned line contact.

A flash EEPROM as a semiconductor device using the self-aligned line contact will be below described as an example. A plurality of device isolation structures are first formed to define a plurality of active regions. Word lines surrounded by a spacer insulating film are then formed and a source/drain diffusion layer is formed. Next, an interlayer insulating film is then deposited and flattened. A self-aligned contact hole through which the plurality of the source diffusion layers are exposed is formed by a self-aligned source contact process and the self-aligned contact is filled with a conductive layer to form a source line contact.

As such, the source line contact connects the plurality of the source diffusion layers into one. Therefore, if a two-dimensional current flow is generated as in a prior art, current flows along the line contact made of a conductive material of a low resistance but current does not flow into the source diffusion layer formed by ion implantation process. Thus, it could not be seen that defective contact occurred in respective source diffusion layers.

Considering advantages that allows the test pattern for measuring a contact resistance to diagnose in advance problems generated in an actual device to prevent defective devices in advance and to reduce unnecessary time and cost, there is a need for a test pattern for measuring a contact resistance suitable for a semiconductor device using the self-aligned line contact.

SUMMARY OF THE INVENTION

The present invention is contrived to solve the above problems and an object of the present invention is to provide a test pattern for measuring a contact resistance and method of manufacturing the same, capable of easily measuring a contact resistance in a semiconductor device using a self-aligned line contact.

In order to accomplish the above object, a test pattern for measuring a contact resistance according to the present invention, is characterized in that it comprises a test wafer in which a plurality of device isolation structures are formed to define a plurality of active regions; a plurality of interconnection diffusion layer formed in a word line region crossing the plurality of the device isolation structures and the plurality of the active regions; a plurality of source diffusion layers formed in a first line contact region located at one side of the word line region; a plurality of source diffusion layers formed in a second line contact region located at the other side of the word line region; and a plurality of line contact pattern formed in the first and second line contact regions, wherein the line contact pattern formed in the first line contact region and the line contact pattern formed in the second line contact region are alternately positioned and wherein current for measuring a resistance flows along the first line contact region and the second line contact region between the word line in a three-dimensional manner.

A method of manufacturing a test pattern for measuring a contact resistance according to the present invention, is characterized in that it comprises the steps of forming a plurality of device isolation structures in a test wafer to define a plurality of active regions; performing an impurity ion implantation process to simultaneously form a source diffusion layer in a plurality of active regions of a first line contact region, an interconnection diffusion layer in a plurality of active regions of a word line and a source diffusion layer in a plurality of active regions of a second line contact region; forming a word line surrounded by an insulating film spacer in the word line region; forming an insulating layer the surface of which is flattened on the entire structure including the word line; forming a self-aligned contact mask on the insulating layer; and forming a plurality of line contact patterns in the first and second line contact regions through a self-aligned contact process using the self-aligned contact mask, wherein the line contact pattern formed in the first line contact region and the line contact pattern formed in the second line contact region are alternately positioned and current for measuring a resistance flows along the first line contact region and the second line contact region between the word line in a three-dimensional manner.

Further, a method of manufacturing a test pattern for measuring a contact resistance according to the present invention, is characterized in that it comprises the steps of forming a plurality of device isolation structures in a test wafer to define a plurality of active regions; performing a ion implantation process to form a threshold voltage ion implantation region in the plurality of the active regions in a word line region; forming a word line in the word line region to form a channel for controlling a threshold voltage; performing an impurity ion implantation process to form a source diffusion layer in each of the plurality of the active regions of a first line contact region and a source diffusion layer in each of the plurality of the active regions of a second line contact region; forming an insulating film spacer surrounding the word line; forming an insulating layer the surface of which is flattened on the entire structure including the word line; forming a self-aligned contact mask on the insulating layer; and forming a plurality of line contact patterns in the first and second line contact regions through a self-aligned contact process using the self-aligned contact mask, wherein the line contact pattern formed in the first line contact region and the line contact pattern formed in the second line contact region are alternately positioned and current for measuring a resistance flows along the first line contact region and the second line contact region between the word line in a three-dimensional manner.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
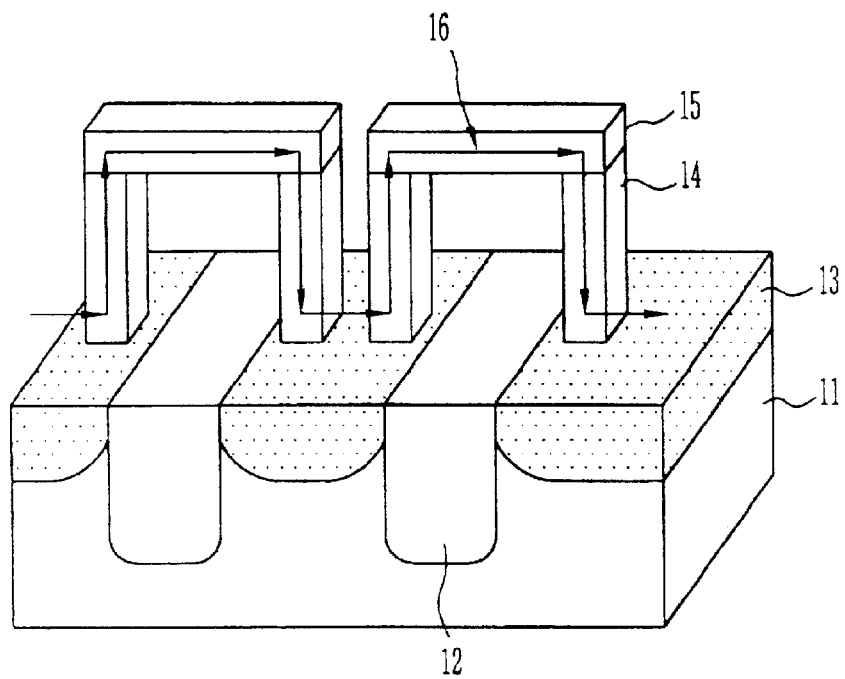
FIG. 1 is a structure of a test pattern for measuring a conventional contact resistance.

The present invention will be described in detail by way of a preferred embodiment with reference to accompanying drawings, in which like reference numerals are used to identify the same or similar parts.

Figure 2:
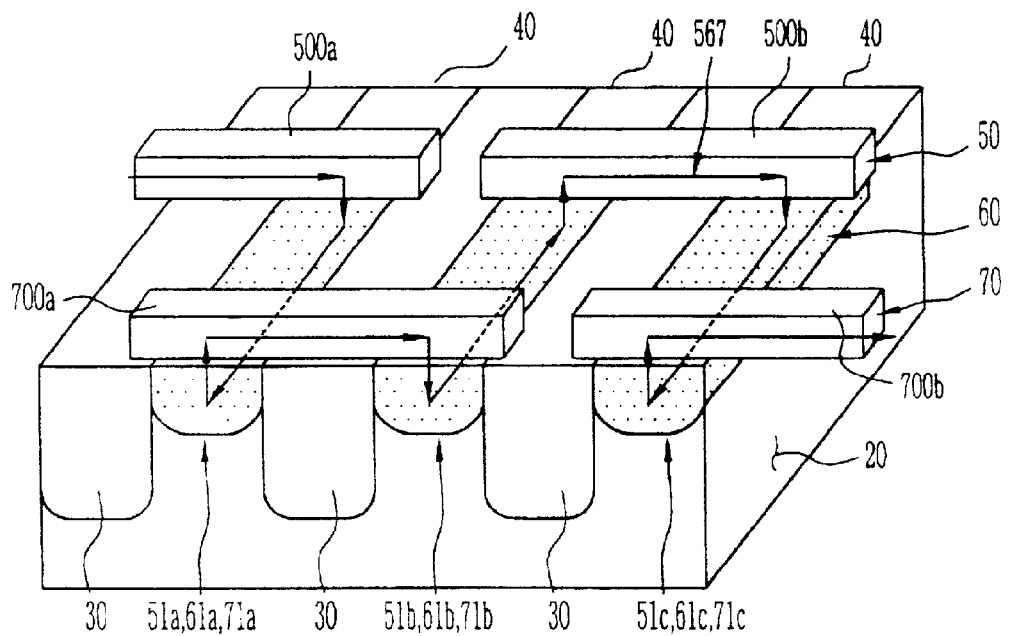
FIG. 2 is a structure of a test pattern for measuring a contact resistance according to the present invention.

FIG. 2 is a structure of a test pattern for measuring a contact resistance according to the present invention.

As can be seen from FIG. 2, the test pattern for measuring a contact resistance of the present invention includes a plurality of device isolation structures 30 on a test wafer 20 to define a plurality of active regions 40; a plurality of interconnection diffusion layers 61a, 61b or 61c in word line regions 60 crossing the plurality of the device isolation structures 30 and a plurality of active regions; a plurality of source diffusion layers 51a, 51b and 5ic in a first line contact region 50 located at one side of the word line regions 60; a plurality of source diffusion layers 71a, 71b and 71c in a second line contact region 70 located at the other side of the word line regions 60; a plurality of line contact patterns 500a and 500b in the first line contact region 50; and a plurality of line contact patterns 700a and 700b in the second line contact region 70. A current path 567 is constructed to form a three-dimensional flow of current including the first line contact pattern 500a in the first line contact region 50, a first source diffusion layer 51 in the first line contact region 50, the interconnection diffusion layer 61a in the word line region 60, the first source diffusion layer 71a in the second line contact region 70, a first line contact pattern 700a in the second line contact region 70, and the second source diffusion layer 71b in the second line contact region 70.

In the above, the source diffusion layers 51a/71a or 51b/71b or 51c/71c neighboring to the first line contact region 50 and the second line contact region 70 are electrically connected by the interconnection diffusion layers 61a, 61b or 61c in the word line region 60. Each of the plurality of the line contact patterns 500a, 500b, 700a and 700b formed in the first and second line contact regions 50 and 70 are isolated/positioned so that they can be electrically connected to only every two source diffusion layers 51b/51c or 71a/71b. Also, the line contact patterns 500a and 500b formed in the first line contact region 50 and the line contact patterns 700a and 700b formed in the second line contact region 70 are alternately positioned.

In the test pattern for measuring a contact resistance of the present invention, current for measuring the resistance can flow along the first line contact region 50 and the second line contact region 70, in a three-dimension manner, as in the current path 567 shown in FIG. 2. Therefore, a line contact resistance can be measured considering the contact resistance at the source diffusion layers 51a, 51b, 51c, 71a, 71b or 71c portion.

A method of manufacturing the test pattern for measuring a contact resistance for use in a semiconductor device using the self-aligned line contact will be below described by reference to FIG. 3~FIG. 5 and FIG. 6~FIG. 8.

Figure 3A:
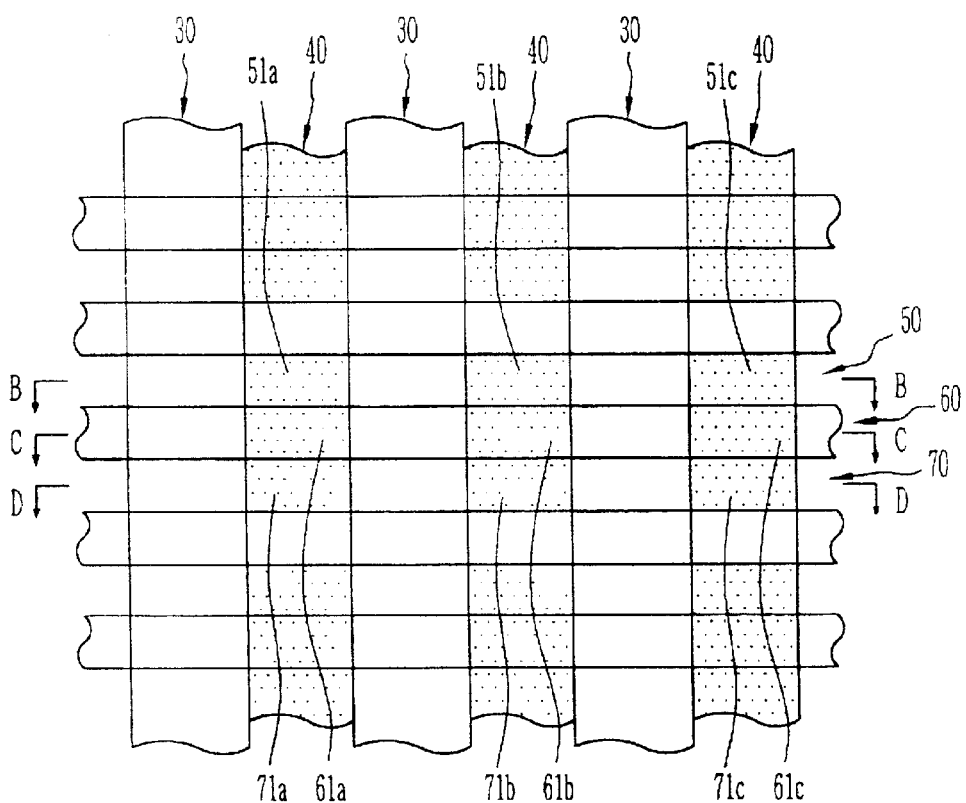
FIG. 3~FIG. 5 are cross sectional views for describing a method of manufacturing a test pattern for measuring a contact resistance in FIG. 2 according to a first embodiment of the present invention.
Figure 3B:
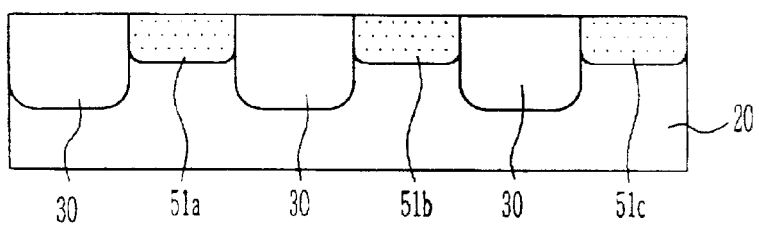
Figure 3C:
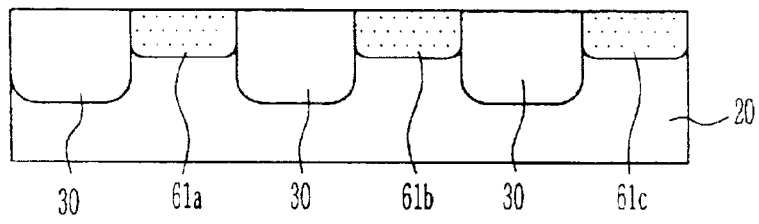
Figure 3D:
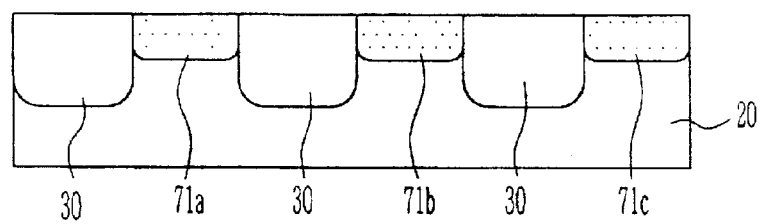
Figure 4A:
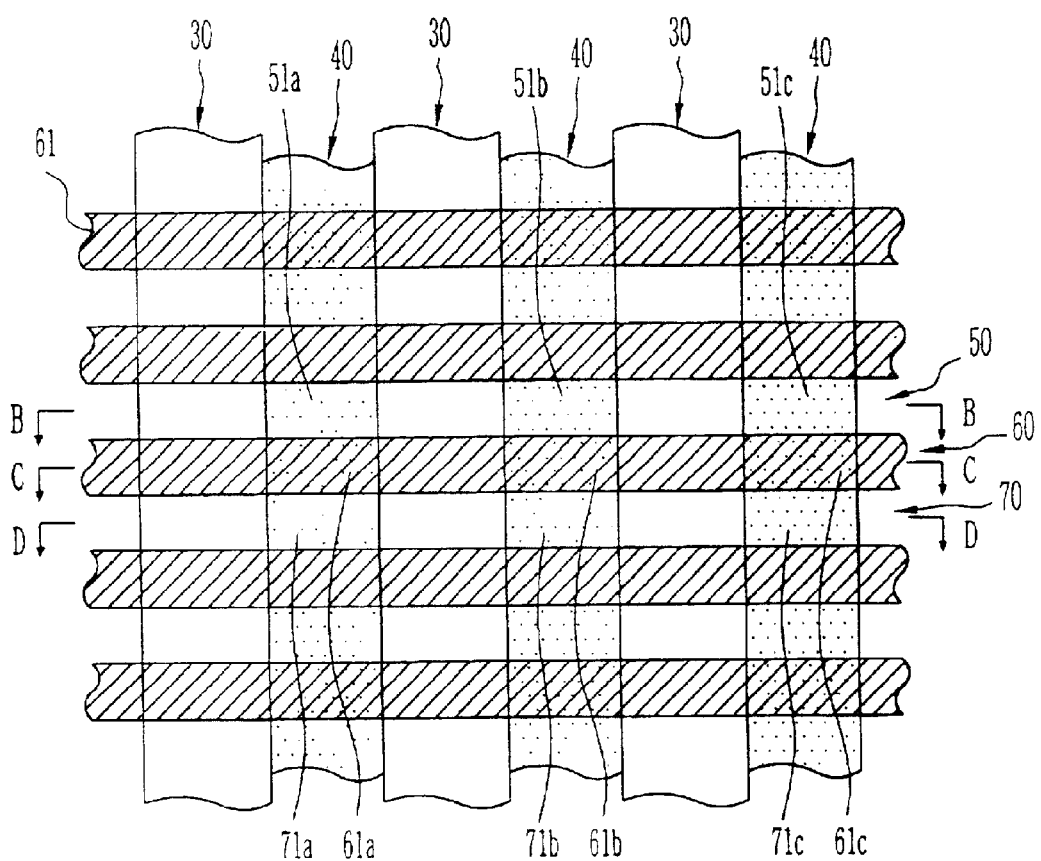
Figure 4B:
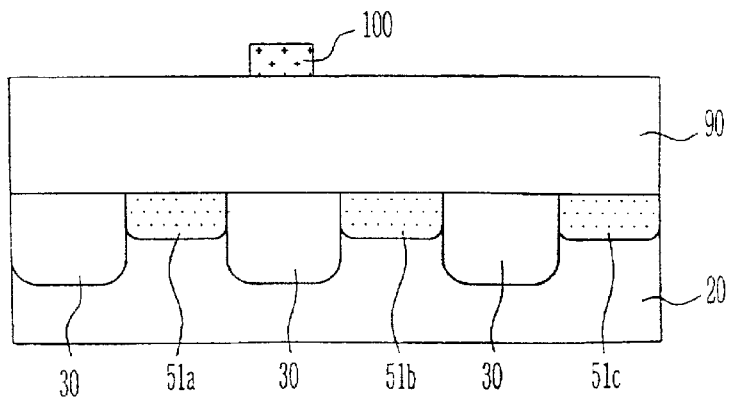
Figure 4C:
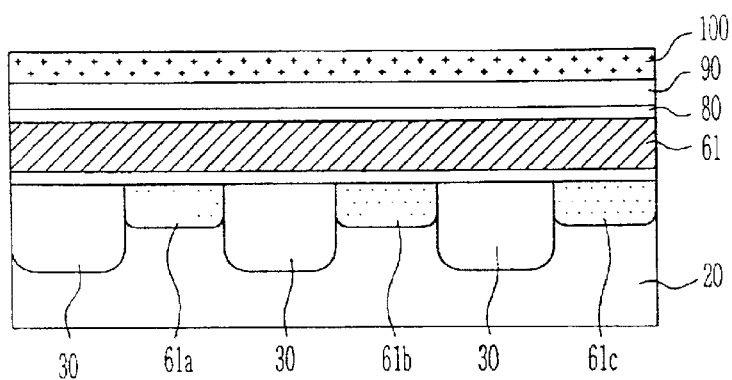
Figure 4D:
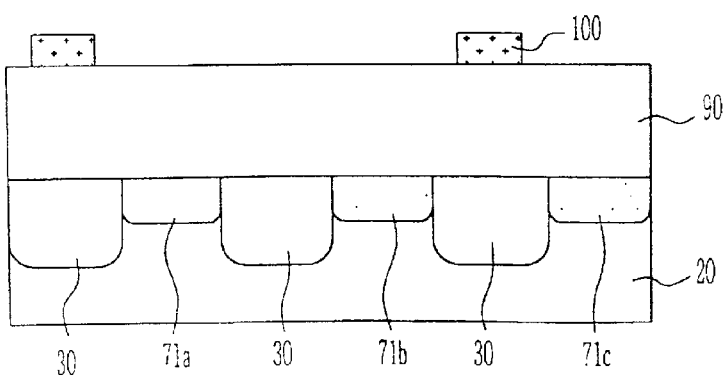
Figure 5B:
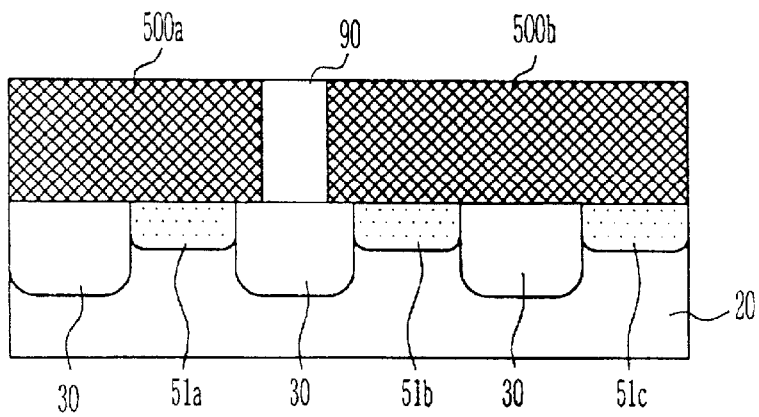
Figure 5C:
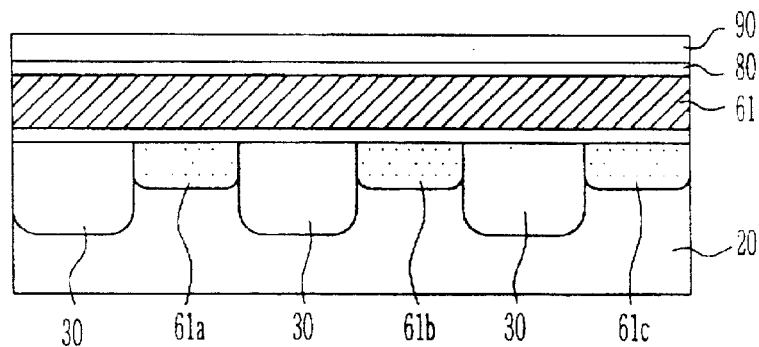
Figure 5D:
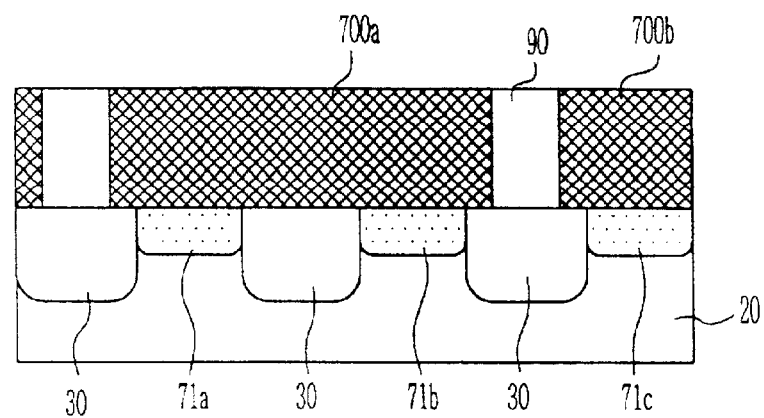

FIG. 3~FIG. 5 are cross sectional views for describing a method of manufacturing a test pattern for measuring a contact resistance in FIG. 2 according to a first embodiment of the present invention, wherein FIG. 3a, FIG. 4a and FIG. 5a illustrates a layout; FIG. 3b, FIG. 4b and FIG. 5b are cross sectional views of the test pattern taken along lines B—B in FIG. 3a, FIG. 4a and FIG. 5a, respectively; FIG. 3c, FIG. 4c and FIG. 5c are cross-sectional views of the test pattern taken along lines C—C in FIG. 3a, FIG. 4a and FIG. 5a, respectively; and FIG. 3d, FIG. 4d and FIG. 5d are cross-sectional views of the test pattern taken along lines D—D in FIG. 3a, FIG. 4a and FIG. 5a, respectively.

Referring now to FIG. 3, the plurality of the device isolation structures 30 are formed in the test wafer 20 to define the plurality of active regions 40. The first line contact region 50 and the second line contact region 70 are defined so that a pair of the line contact regions can be formed between the word line region 60. An impurity implantation process is implemented to form the source diffusion layers 51a, 51b and 51c in each of the plurality of the active regions 40 of the first line contact region 50, the interconnection diffusion layers 61a, 61b and 61c in each of the plurality of the active regions 40 of the word line region 60 and the source diffusion layers 71a, 71b and 71c in each of the plurality of the active region 40 of the second line contact region 70, at the same time.

In the above, the first line contact region 50 and the second line contact region 70 are electrically connected by the plurality of interconnection diffusion layers 61a, 61b and 61c. More particularly, the first source diffusion layers 51a and 71a in the first and second line contact regions 50 and 70 are electrically connected by the first interconnection diffusion layer 61a in the word line region 60, the second source diffusion layers 51b and 71b in the first and second line contact regions 50 and 70 are electrically connected by the second interconnection diffusion layer 61b in the word line region 60, and the third source diffusion layers 51c and 71c in the first and second line contact regions 50 and 70 are electrically connected by the third interconnection diffusion layer 61c in the word line region 60.

Referring now to FIG. 4, the word line 61 surrounded by an insulating film spacer 80 is formed in the word line region 60. An insulating layer 90 the surface of which is flattened is formed on the entire structure including the word line 61. A self-aligned contact mask 100 is formed on the insulating layer 90.

In the above, the self-aligned contact mask 100 is formed to cover an upper portion of the word line 61, an upper portion of a portion of the device isolation structure 30 between the first source diffusion layer 51a and the second source diffusion layer 51b in the first line contact region 50, and an upper portion of a portion of the device isolation structure 30 between the second source diffusion layer 71b and the third source diffusion layer 71c in the second line contact region 70.

Referring now to FIG. 5, a self-aligned contact etch process using the self-aligned contact mask 100 is implemented to form a plurality of self-aligned contact holes. After the self-aligned contact mask 100 is removed, the plurality of the self-aligned contact holes are filled with a conductive material to form the plurality of the line contact patterns 500a, 500b, 700a and 700b, thus completing the test pattern for measuring a contact resistance of the present invention.

In the above, the plurality of the line contact patterns 500a, 500b, 700a and 700b are isolated/positioned in each of the first and second line contact regions 50 and 70. The first line contact pattern 500a for electrically connecting a source diffusion layer (not shown) and the first source diffusion layer 51a, and the second line contact pattern 500b for electrically connecting the second and third source diffusion layers 51b and 51c are isolated/positioned in the first line contact region 50. Also, the first line contact pattern 700a for electrically connecting the first and second source diffusion layers 71a and 71b, and the second line contact pattern 700b for electrically connecting the third source diffusion layer 71c and a source diffusion layer (not shown) are isolated/positioned in the second line contact region 70.

A process of manufacturing the test pattern for measuring a contact resistance or the present invention is performed based on a design rule of a method of manufacturing an actual device for which a test pattern for measurement will be used A method of measuring the contact resistance using the test pattern for measuring the contact resistance of the present invention will be described in short as follows.

Assuming that the number of a contact is "N", the resistance of the line contact pattern is "Rm", the resistance of the contact is "Rc", the resistance of the diffusion layer is "Rd", the voltage applied to measure the resistance is "V" and the current measured against the voltage "V" is "I", the total resistance "RT" and the contact resistance "Rc" can be found by the following [Equation 1].

$$RT=Nx(+Rc+Rd)=V/I \quad \text{[Equation 1]}$$
$$RC=V/(N \times I) - Rm - Rd \approx V/(N \times I) - Rd$$

Figure 6A:
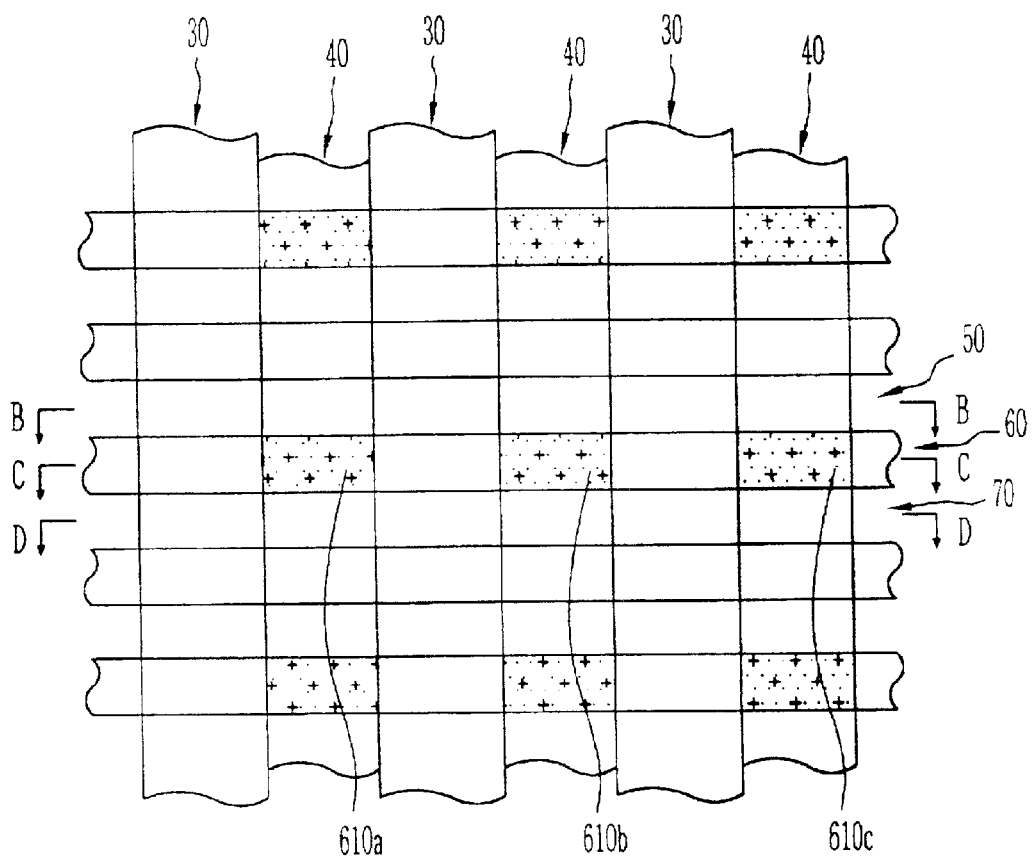
FIG. 6~FIG. 8 are cross sectional views for describing a method of manufacturing a test pattern for measuring a contact resistance in FIG. 2 according to a second embodiment of the present invention.
Figure 6B:
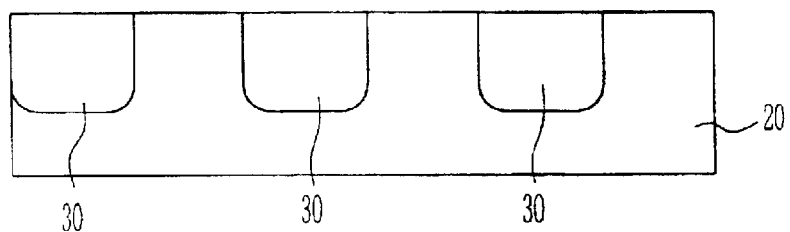
Figure 6C:
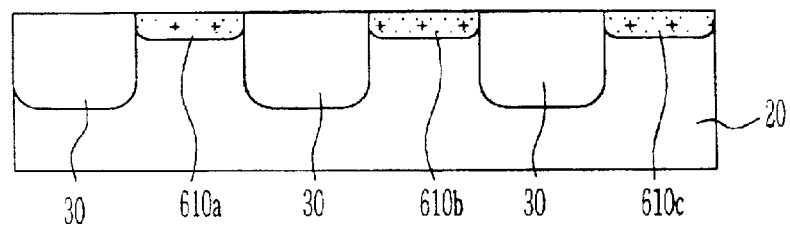
Figure 6D:
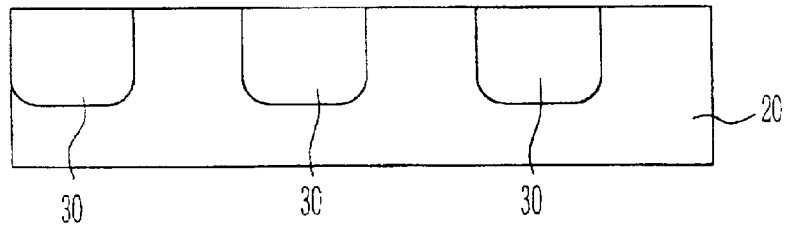
Figure 7A:
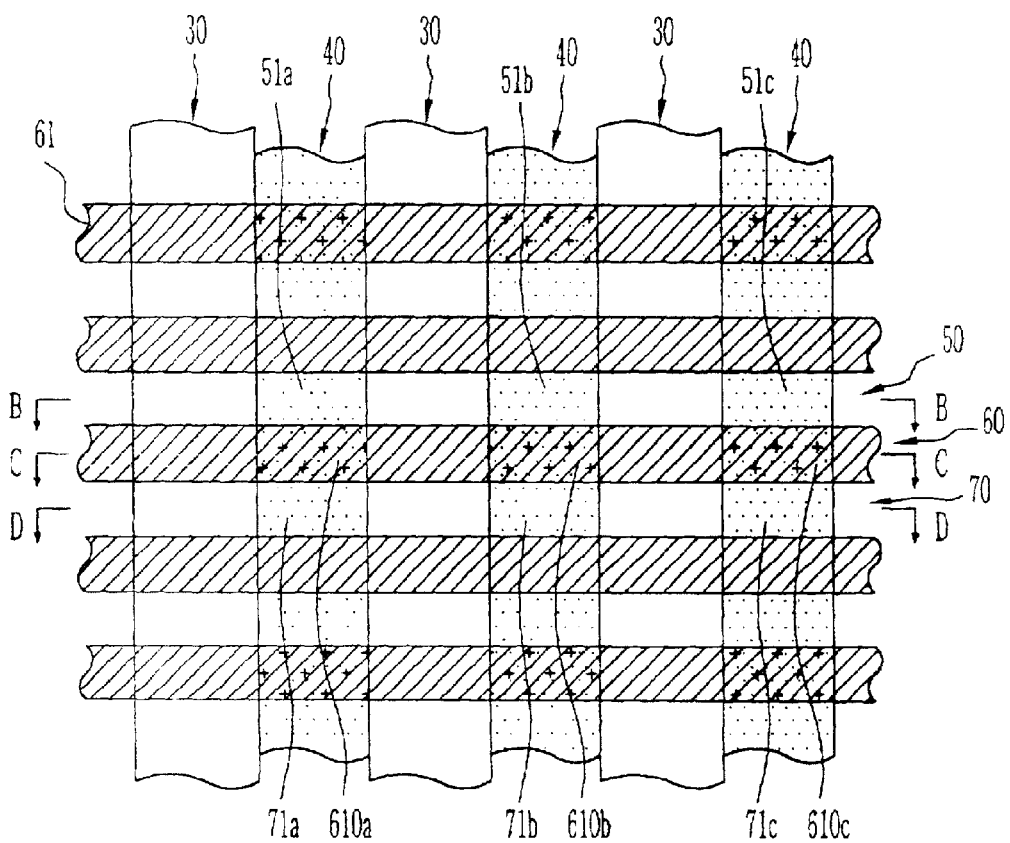
Figure 7B:
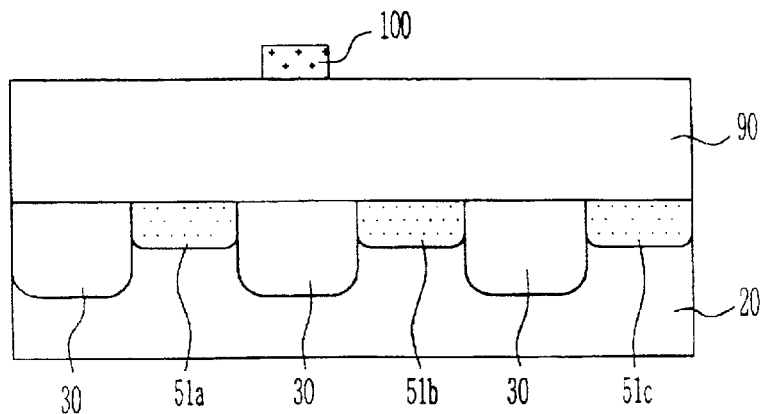
Figure 7C:
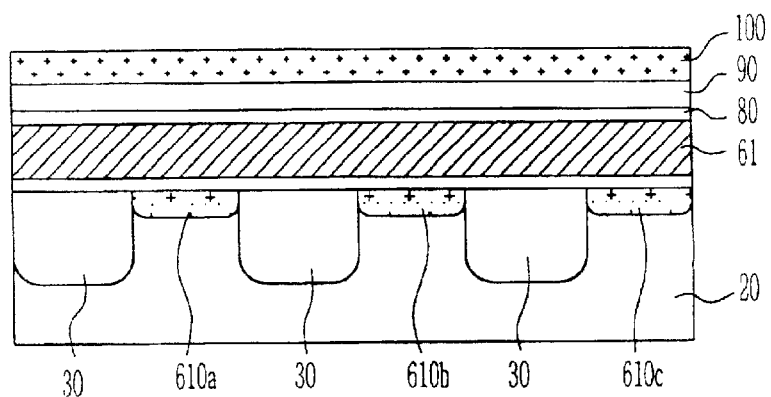
Figure 7D:
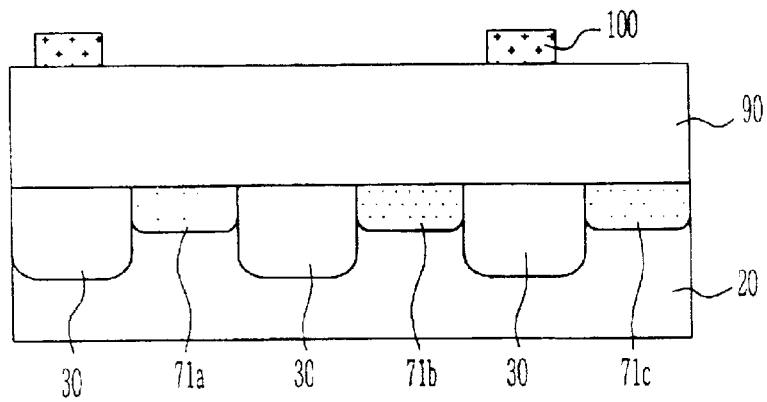
Figure 8A:
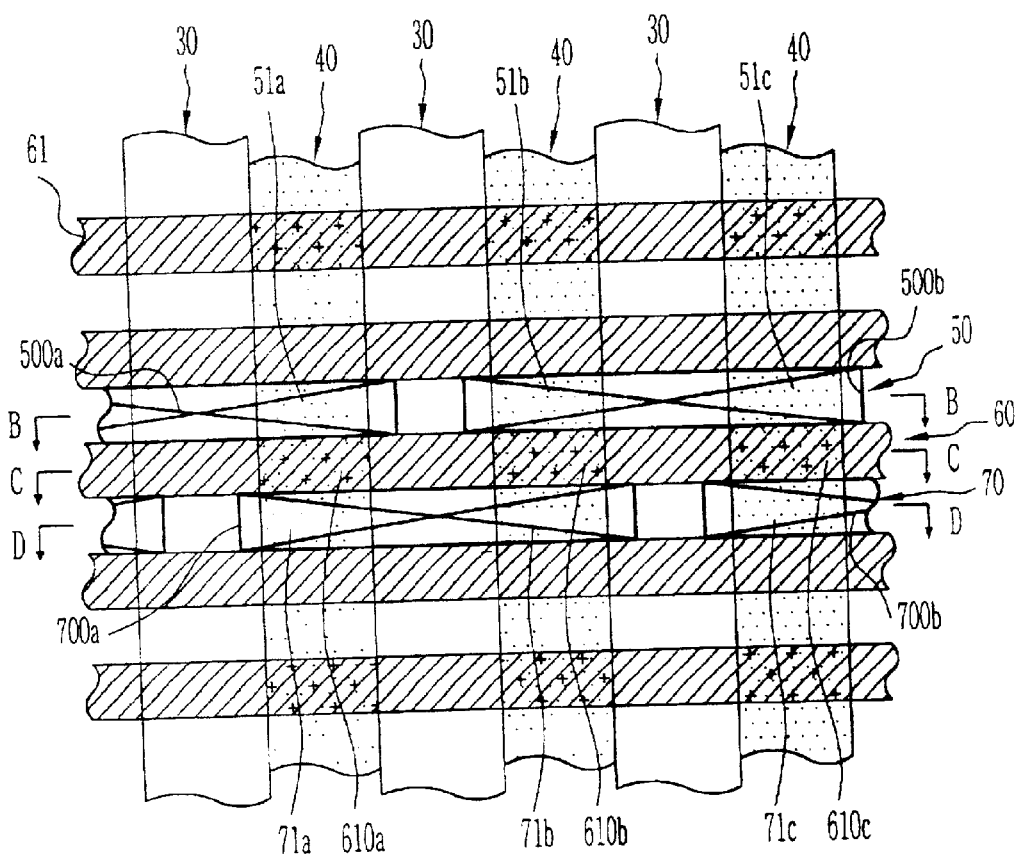
Figure 8B:
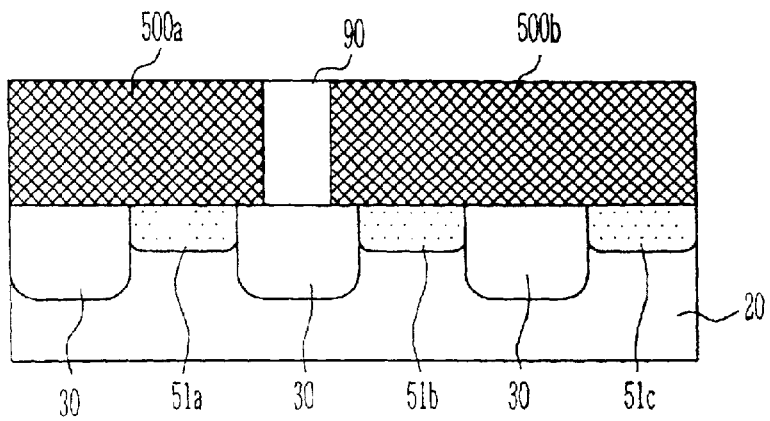
Figure 8C:
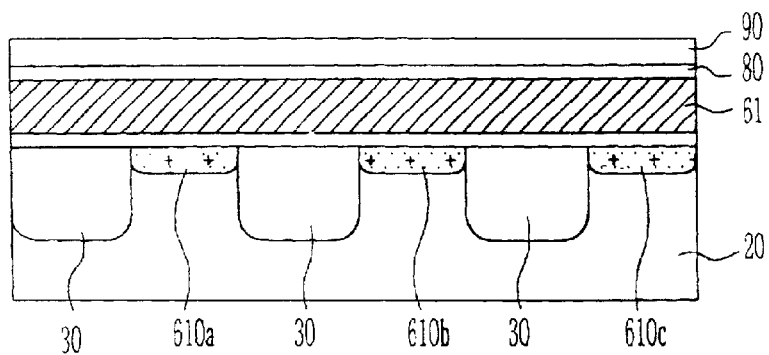
Figure 8D:
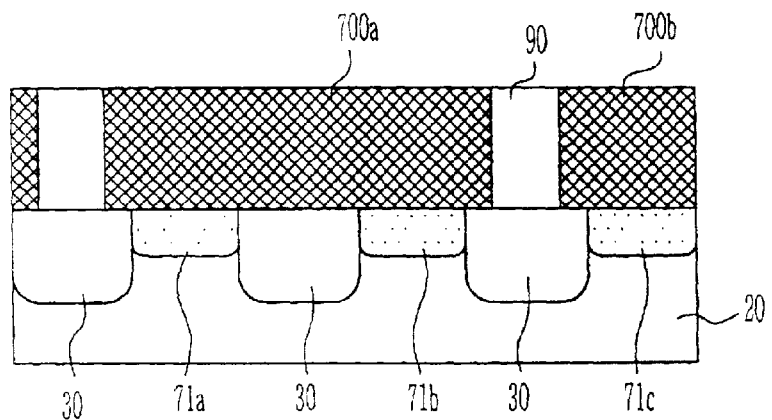

FIG. 6~FIG. 8 are cross sectional views for describing a method of manufacturing a test pattern for measuring a contact resistance in FIG. 2 according to a second embodiment of the present invention, wherein FIG. 6a, FIG. 7a and FIG. 8a illustrate layouts; FIG. 6b, FIG. 7b and FIG. 8b are cross-sectional view of the test pattern taken along lines B—B in FIG. 6a, FIG. 7a and FIG. 8a, respectively; FIG. 6c, FIG. 7c and FIG. 8c are cross-sectional view of the test pattern taken along lines C—C in FIG. 6a, FIG. 7a and FIG. 8a, respectively; and FIG. 6d, FIG. 7d and FIG. 8d are cross-sectional view of the test pattern taken along lines D—D in FIG. 6a, FIG. 7a and FIG. 8a, respectively.

Referring now to FIG. 6, the plurality of the device isolation films structures 30 are formed in the test wafer 20 to define the plurality of the active regions 40. The first line contact region 50 and the second line contact region 70 are defined so that the line contact region can form a pair between the word line regions 60. An ion implantation process is performed to form the threshold voltage ion implantation regions 610a, 610b and 610c in each of the active regions 40 in the word line region 60 to form a channel for controlling a threshold voltage.

Referring now to FIG. 7, the word line 61 is formed in the word line region 60 in which the plurality of the ion implantation regions 610a, 610b and 610c are formed. An impurity ion implantation process is performed to form the source diffusion layers 51a, 51b and 51c in each of the plurality of the active regions 40 of the first line contact region 50 and the source diffusion layers 71a, 7b and 71c in each of the plurality of the active regions 40 in the second line contact region 70. Then, the insulating film spacer 80 surrounding the word line 61 is formed by a deposition process of the insulating film and an etch process of the spacer. Next, the insulating layer 90 the surface of which is flattened is formed on the entire structure including the word line 61. Next, the self-aligned contact mask 100 is formed on the insulating layer 90.

In the above, the first line contact region 59 and the second line contact region 70 are electrically connected by the plurality of the ion implantation regions 610a, 610b and 610c. More particularly, the first source diffusion layers 51a and 71a in the first and second line contact regions 50 and 70 are electrically connected by the first ion implantation region 610a in the word line region 60, the second source diffusion layers 51b and 71b in the first and second line contact regions 50 and 70 are electrically connected by the second ion implantation region 610b in the word line region 60, and the third source diffusion layers 5c and 7c in the first and second line contact regions 50 and 70 are electrically connected by the third ion implantation region 610c in the word line region 60. In order for them to be electrically connected, a voltage must be applied to the word line 60 to form a channel.

The self-aligned contact mask 100 is formed to cover an upper portion of the word line 61, an upper portion of a portion of the device isolation structure 30 between the first source diffusion layer 51a and the second source diffusion layer 51b in the first line contact region 50, and an upper portion of a portion of the device isolation structure 30 between the second source diffusion layer 71b and the third source diffusion layer 71c in the second line contact region 70.

Referring now to FIG. 8, a self-aligned contact etch process using the self-aligned contact mask 100 is performed to form the plurality of the self-aligned contact holes. After the self-aligned contact mask 100 is removed, the plurality of the self-aligned contact holes are filled with a conductive material to form the plurality of the line contact patterns 500a, 500b, 700a and 700b, thus completing the test pattern for measuring a contact resistance of the present invention.

In the above, the plurality of the line contact patterns 500a, 500b, 700a and 700b are isolated/positioned in each of the first and second line contact regions 50 and 70. The first line contact pattern 500a for electrically connecting a source diffusion layer (not shown) and the first source diffusion layer 51a, and the second line contact pattern 500b for electrically connecting the second and third source diffusion layers 51b and 51c are isolated/positioned in the first line contact region 50. Also, the first line contact pattern 700a for electrically connecting the first and second source diffusion layers 71a and 71b, and the second line contact pattern 700b for electrically connecting the third source diffusion layer 71c and the source diffusion layer (not shown) are isolated/positioned in the second line contact region 70.

A process of manufacturing the test pattern for measuring a contact resistance or the present invention is performed based on a design rule of a method of manufacturing an actual device for which a test pattern for measurement will be used The first and second embodiment of the present invention relate to a method of manufacturing a test pattern for measuring a contact resistance. The test pattern for measuring a contact resistance manufactured by the first embodiment and the test pattern for measuring a contact resistance manufactured by the second embodiment are same in structure to the test pattern for measuring a contact resistance shown in FIG. 2. in the test pattern for measuring a contact resistance manufactured by the second embodiment, however, a voltage must be applied the word line 61 between the first and second line contact regions 50 and 70 in order to measure the contact resistance and a voltage must not be applied to the word line 61 outside the first and second line contact regions 50 and 70.

As mentioned above, the present invention has outstanding advantages that it can easily measure a contact resistance suitable for a semiconductor device and diagnose in advance a problem that may occur in an actual device based on the measured contact resistance data before an actual process for manufacturing the device using a self-aligned line contact is performed. Further, the present invention can not only consider a new method of reducing the contact resistance but also determine to what extent the cell area can be reduced.

In addition, the present invention can not only increase the throughput of the device but also reduce unnecessary time and cost by preventing in advance defective devices.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A test pattern for measuring a contact resistance, comprising:
    a test wafer in which a plurality of device isolation structures are formed to define a plurality of active regions;
    a plurality of interconnection diffusion layers formed in a word line region crossing the plurality of device isolation structures and the plurality of active regions;
    a plurality of source diffusion layers formed in a first line contact region located at a first side of the word line region;
    a plurality of source diffusion layers formed in a second line contact region located at a second side of the word line region; and
    a plurality of line contact patterns formed in the first and second line contact regions,
    wherein the line contact patterns formed in the first line contact region and the line contact patterns formed in the second line contact region are alternately positioned, and current for measuring a resistance flows along the first line contact region and the second line contact region between the word line in three dimensions.

2. The test pattern according to claim 1, wherein the word line region, the first line contact region, and the second line contact region are juxta-positioned.

3. The test pattern according to claim 1, wherein the source diffusion layer in the first line contact region and the source diffusion layer in the second line contact region are electrically connected by an interconnection diffusion layer in the word line region.

4. The test pattern according to claim 1, wherein one of the plurality of line contact patterns in the first line contact region electrically connects two of the plurality of source diffusion layers in the first line contact region and is alternately positioned with another one of the plurality of line contact patterns.

5. The test pattern according to claim 1, wherein one of the plurality of line contact patterns in the second line contact region electrically connects two of the plurality of source diffusion layers in the second line contact region, and is alternately positioned with another one of the plurality of line contact patterns.

6. A method of manufacturing a test pattern for measuring a contact resistance, comprising:
    forming a plurality of device isolation structures in a test wafer to define a plurality of active regions;
    simultaneously forming a plurality of source diffusion layers in ones of the plurality of active regions of a first line contact region, a plurality of interconnection diffusion layers in ones of the plurality of active regions of a word line, and a plurality of source diffusion layers in ones of the plurality of active regions of a second line contact region;

forming a word line surrounded by an insulating film spacer in the word line region;

forming an insulating layer on an entire structure including the word line, the insulating layer having a flattened surface;

forming a self-aligned contact mask on the insulating layer; and forming a plurality of line contact patterns in the first and second line contact regions through a self-aligned contact process using the self-aligned contact mask, wherein the line contact pattern formed in the first line contact region and the line contact pattern formed in the second line contact region are alternatingly positioned, and current for measuring a resistance flows along the first line contact region and the second line contact region between the word line in three dimensions.

7. The method according to claim 6, wherein the word line region, the first line contact region, and the second line contact region are juxta-positioned crossing the plurality of device isolation structures and the plurality of active regions.

8. The method according to claim 6, wherein one of the plurality of source diffusion layers in the first line contact region and one of the plurality of the source diffusion layers in the second line contact region are electrically connected by one of the plurality of interconnection diffusion layers in the word line region.

9. The method according to claim 6, wherein one of the plurality of line contact patterns in the first line contact region electrically connects two of the plurality of source diffusion layers in the first line contact region and is alternately positioned with another one of the plurality of line contact patterns.

10. The method according to claim 6, wherein one of the plurality of line contact patterns in the second line contact region electrically connects two of the plurality of source diffusion layers in the second line contact region, and is alternately positioned with another one of the plurality of line contact patterns.

11. The method according to claim 6, wherein the self-aligned contact mask is formed to cover an upper portion of the word line, an upper portion of the device isolation structure between a first one of the plurality of source diffusion layers and a second one of the plurality of source diffusion layers in the first line contact region, and an upper portion of the device isolation structure between the second one of the plurality of source diffusion layers and a third one of the plurality of source diffusion layers in the second line contact region.

12. A method of manufacturing a test pattern for measuring a contact resistance, comprising:

forming a plurality of device isolation structures in a test wafer to define a plurality of active regions;

forming an ion implantation region in the plurality of active regions in a word line region to form a channel for controlling a threshold voltage;

forming a word line in the word line region;

forming a plurality of source diffusion layers in each of the plurality of active regions of a first line contact region;

forming a plurality of source diffusion layers in each of the plurality of active regions of a second line contact region;

forming an insulating film spacer surrounding the word line;

forming an insulating layer on an entire structure including the word line, the insulating layer having a flattened surface;

forming a self-aligned contact mask on the insulating layer; and forming a plurality of line contact patterns in the first and second line contact regions through a self-aligned contact process using the self-aligned contact mask, wherein the line contact pattern formed in the first line contact region and the line contact pattern formed in the second line contact region are alternatingly positioned, and current for measuring a resistance flows along the first line contact region and the second line contact region between the word line in three dimensions.

13. The method according to claim 12, wherein the word line region, the first line contact region, and the second line contact region are juxta-positioned crossing the plurality of device isolation structures and the plurality of active regions.

14. The method according to claim 12, wherein the plurality of source diffusion layers in the first line contact region and the plurality of source diffusion layers in the second line contact region are electrically connected by the ion implantation region in the word line region.

15. The method according to claim 12, wherein one of the plurality of line contact patterns in the first line contact region electrically connects two of the plurality of source diffusion layers in the first line contact region, and is alternately positioned with another one of the plurality of line contact patterns.

16. The method according to claim 12, wherein one of the plurality of line contact patterns in the second line contact region electrically connects two of the plurality of source diffusion layers in the second line contact region, and is alternately positioned with another one of the plurality of line contact patterns.

17. The method according to claim 12, wherein the self-aligned contact mask is formed to cover an upper portion of the word line, an upper portion of the device isolation structure between a first one of the plurality of source diffusion layers and a second one of the plurality of source diffusion layers in the first line contact region, and an upper portion of the device isolation structure between the second one of the plurality of source diffusion layers and a third one of the plurality of source diffusion layers in the second line contact region.

* * * * *